United States Patent
Shimba

(10) Patent No.: US 10,276,602 B2
(45) Date of Patent: Apr. 30, 2019

(54) ARRAY SUBSTRATE AND RADIATION DETECTOR

(71) Applicant: CANON ELECTRON TUBES & DEVICES CO., LTD., Otawara-shi (JP)

(72) Inventor: Yuichi Shimba, Utsunomiya (JP)

(73) Assignee: Canon Electron Tubes & Devices Co., Ltd., Otawara-shi (JP)

(*) Notice: Subject to any disclaimer, the term of this patent is extended or adjusted under 35 U.S.C. 154(b) by 0 days.

(21) Appl. No.: 15/786,970

(22) Filed: Oct. 18, 2017

(65) Prior Publication Data

US 2018/0040636 A1 Feb. 8, 2018

Related U.S. Application Data

(63) Continuation of application No. PCT/JP2016/067096, filed on Jun. 8, 2016.

(30) Foreign Application Priority Data

Jun. 10, 2015 (JP) ................................. 2015-117551

(51) Int. Cl.
*G01T 1/24* (2006.01)
*H01L 27/12* (2006.01)
(Continued)

(52) U.S. Cl.
CPC ............ *H01L 27/124* (2013.01); *G01T 1/247* (2013.01); *H01L 27/14* (2013.01); *H01L 27/144* (2013.01);
(Continued)

(58) Field of Classification Search
CPC ........... G01T 1/2018; G01T 1/20; G01T 1/24; H01L 27/14663; H04N 5/32
See application file for complete search history.

(56) References Cited

U.S. PATENT DOCUMENTS

2016/0148953 A1* 5/2016 Takikawa .......... H01L 27/14603
257/72

FOREIGN PATENT DOCUMENTS

JP 2004-228518 8/2004
JP 2006-004998 A 1/2006
(Continued)

OTHER PUBLICATIONS

Translation of JP 2007093449 A.*
(Continued)

*Primary Examiner* — David Porta
*Assistant Examiner* — Mamadou Faye
(74) *Attorney, Agent, or Firm* — Oblon, McClelland, Maier & Neustadt, L.L.P.

(57) ABSTRACT

An array substrate according to an embodiment includes a substrate having a first side and a second side, multiple control lines, multiple data lines, a first region having multiply first interconnect pads, and a second region having multiply second interconnect pads. There is at least one of a distance between the first side and a center line of the first region being longer than a distance between the first side and a center line extending in the first direction of a region including the multiple control lines electrically connected to the multiple first interconnect pads, or a distance between the second side and a center line of the second region being longer than a distance between the second side and a center line extending in the second direction of a region including the multiple data lines electrically connected to the multiple second interconnect pads.

5 Claims, 6 Drawing Sheets

(51) Int. Cl.
  *H01L 27/14*     (2006.01)
  *H01L 27/144*    (2006.01)
  *H04N 5/32*      (2006.01)
  *H01L 27/146*    (2006.01)
  *H04N 5/3745*    (2011.01)
  *H04N 5/374*     (2011.01)

(52) U.S. Cl.
  CPC .. *H01L 27/14603* (2013.01); *H01L 27/14612* (2013.01); *H01L 27/14636* (2013.01); *H01L 27/14659* (2013.01); *H01L 27/14663* (2013.01); *H04N 5/32* (2013.01); *H04N 5/374* (2013.01); *H04N 5/3745* (2013.01); *H04N 5/37452* (2013.01)

(56) References Cited

FOREIGN PATENT DOCUMENTS

| | | | |
|---|---|---|---|
| JP | 2007-93449 | | 4/2007 |
| JP | 2007093449 A | * | 4/2007 |
| JP | 2009-128023 | | 6/2009 |
| JP | 2015-50236 | | 3/2015 |
| JP | 2015050236 A | * | 3/2016 |

OTHER PUBLICATIONS

Translation of JP2015050236A.*
International Search Report dated Aug. 30, 2016 in PCT/JP2016/067096, filed on Jun. 8, 2016 (with English Translation).
Written Opinion dated Aug. 30, 2016 in PCT/JP2016/067096, filed on Jun. 8, 2016.

* cited by examiner

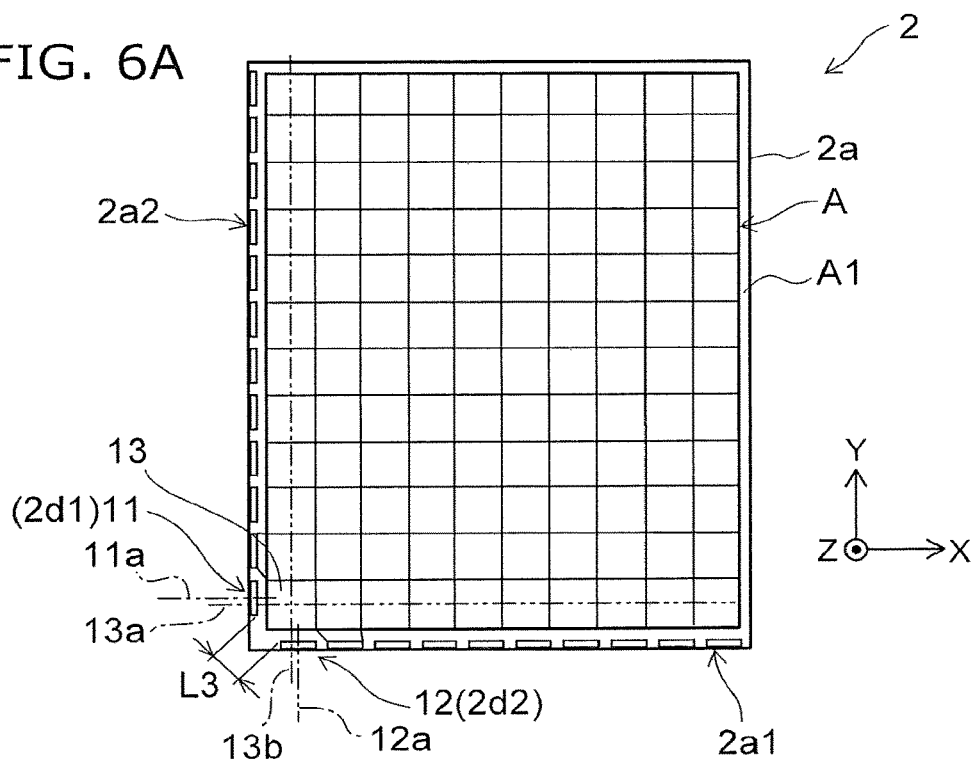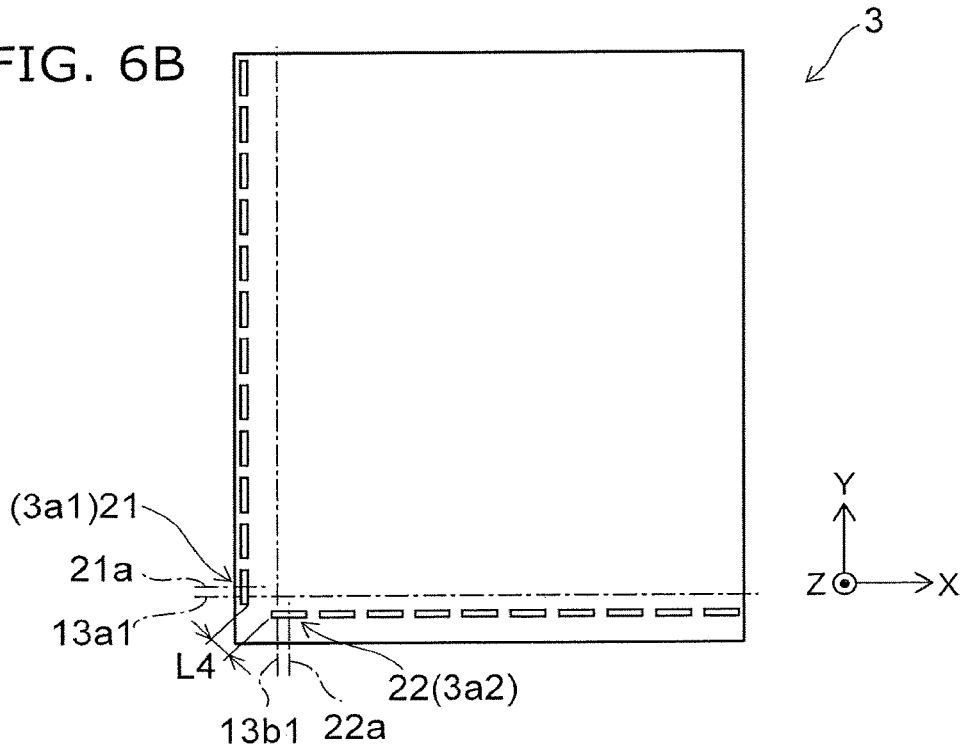

ARRAY SUBSTRATE AND RADIATION DETECTOR

CROSS-REFERENCE TO RELATED APPLICATIONS

This is a continuation application of International Application PCT/JP2016/067096, filed on Jun. 8, 2016. This application also claims priority to Japanese Application No. 2015-117551, filed on Jun. 10, 2015. The entire contents of each are incorporated herein by reference.

FIELD

Embodiments of the invention relates to an array substrate and a radiation detector.

BACKGROUND

An array substrate that includes a scintillator layer converting radiation into fluorescence and a photoelectric conversion element converting the fluorescence into a signal charge, a circuit board that includes a control circuit and/or an amplifier/converter circuit, a flexible printed circuit board that electrically connects the control circuit of the circuit board and control lines provided in the array substrate, a flexible printed circuit board that electrically connects the amplifier/converter circuit of the circuit board and data lines provided in the array substrate, etc., are provided in a radiation detector such as an X-ray detector, etc.

Also, multiple interconnect pads that electrically connect the flexible printed circuit board and the control lines are provided in a peripheral edge region of the array substrate.

Multiple interconnect pads, sockets, etc., that electrically connect the flexible printed circuit board and the control circuit are provided in a peripheral edge region of the circuit board.

Also, multiple interconnect pads that electrically connect the flexible printed circuit board and the data lines are provided in the peripheral edge region of the array substrate.

Multiple interconnect pads, sockets, etc., that electrically connect the flexible printed circuit board and the amplifier/converter circuit are provided in the peripheral edge region of the circuit board.

Here, in recent years, to realize the downsizing of the radiation detector, it has become desirable to downsize the array substrate, that is, to shorten the dimensions of the array substrate in the direction in which the control lines extend and the direction in which the data lines extend.

However, in the case where the array substrate is simply made smaller, the distance between the region where the interconnect pads on the control line side are provided and the region where the interconnect pads on the data line side are provided becomes short.

Therefore, there is a risk that the interconnect operation may become difficult due to interference between the flexible printed circuit boards, etc.

Also, generally, the planar configuration of the flexible printed circuit board is a straight band configuration.

Therefore, in the case where the distance in the array substrate becomes short between the region where the interconnect pads on the control line side are provided and the region where the interconnect pads on the data line side are provided, the distance between the region where the interconnect pads on the control circuit side, etc., are provided and the region where the interconnect pads on the amplifier/converter circuit side, etc., are provided correspondingly becomes short in the circuit board as well.

Also, in the circuit board, it is necessary to provide electronic components such as resistors, semiconductor elements, etc., included in the circuit.

Therefore, in the circuit board, in the case where the distance between the region where the interconnect pads on the control circuit side, etc., are provided and the region where the interconnect pads on the amplifier/converter circuit side, etc., are provided becomes short, there is a risk that the distance between the electronic components included in the control circuit and the electronic components included in the amplifier/converter circuit may become too short; and the arrangement of the electronic components may be difficult.

As a result, there is a risk that the downsizing of the radiation detector can no longer be realized.

BRIEF DESCRIPTION OF THE DRAWINGS

FIG. 6A is a schematic plan view for illustrating the array substrate 2 according to the embodiment;

FIG. 6B is a schematic plan view for illustrating the circuit board 3 according to the embodiment;

DETAILED DESCRIPTION

Figure 1:
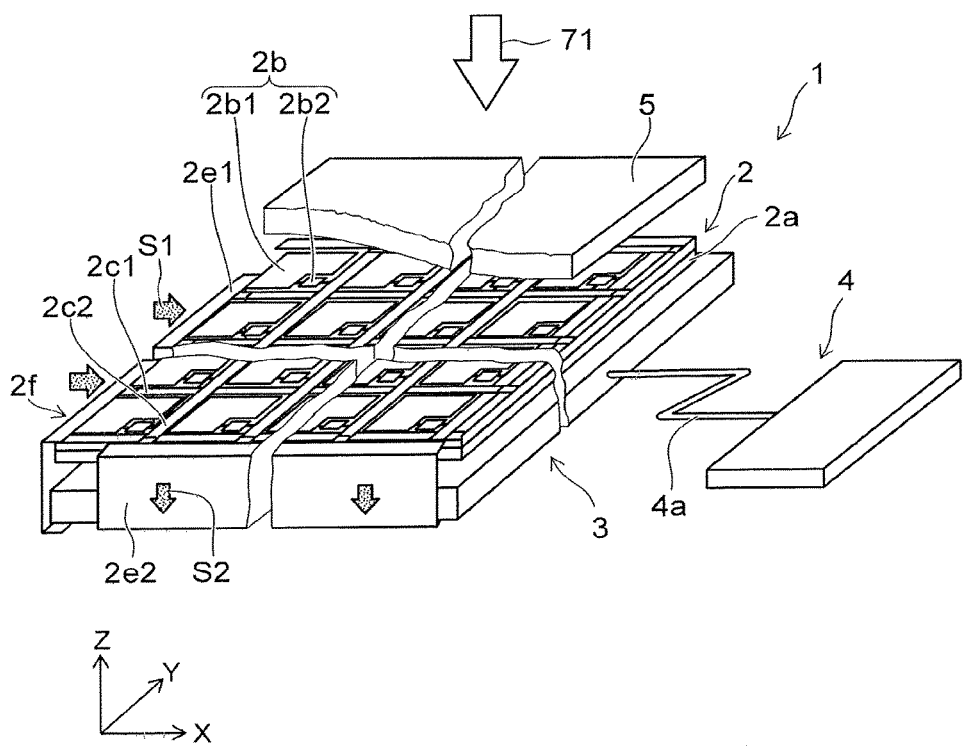
FIG. 1 is a schematic perspective view for illustrating an array substrate 2 and the X-ray detector 1 according to the embodiment.

An array substrate according to an embodiment includes a substrate having a first side extending in a first direction and a second side extending in a second direction crossing the first direction, multiple control lines extending in the first direction and being provided at the substrate, multiple data lines extending in the second direction and being provided at the substrate, photoelectric converters provided respectively in multiple regions defined by the multiple control lines and the multiple data lines, a first region being provided in a peripheral edge region on the second-side side of the substrate and having a first interconnect pad electrically connected to the control line and multiply provided in the first region, and a second region being provided in a peripheral edge region on the first-side side of the substrate and having a second interconnect pad electrically connected to the data line and multiply provided in the second region.

There is at least one of a distance between the first side and a center line extending in the first direction of the first region being longer than a distance between the first side and a center line extending in the first direction of a region including the multiple control lines electrically connected to the multiple first interconnect pads provided in the first region, or a distance between the second side and a center line extending in the second direction of the second region being longer than a distance between the second side and a center line extending in the second direction of a region including the multiple data lines electrically connected to the multiple second interconnect pads provided in the second region.

Embodiments will now be illustrated with reference to the drawings. Similar components in the drawings are marked with the same reference numerals; and a detailed description is omitted as appropriate.

Also, the radiation detector according to the embodiment of the invention is applicable to various radiation such as γ-rays, etc., as well as X-rays. Here, as an example, a case relating to X-rays is described as a typical example of radiation. Accordingly, applications to other radiation also are possible by replacing "X-ray" of the embodiments recited below with "other radiation."

Also, an X-ray detector 1 illustrated below is an X-ray planar sensor that detects an X-ray image which is a radiation image. X-ray planar sensors can be largely divided into a direct conversion method and an indirect conversion method.

The direct conversion method is a method in which the photoconductive charge (the signal charge) generated in the photoconductive film (corresponding to the photoelectric conversion element) interior by incident X-rays is directly guided by a high electric field to a storage capacitor for charge storage.

The indirect conversion method is a method in which the X-rays are converted into fluorescence (visible light) by a scintillator layer; the fluorescence is converted into a signal charge by a photoelectric conversion element such as a photodiode, etc.; and the signal charge is guided to a storage capacitor.

Although the indirect conversion X-ray detector 1 is illustrated as an example in the description recited below, the radiation detector according to the embodiment of the invention is applicable also to direct conversion X-ray detectors.

Also, although the radiation detector according to the embodiment of the invention can be used in, for example, general medical applications, etc., the applications are not limited.

FIG. 1 is a schematic perspective view for illustrating an array substrate 2 and the X-ray detector 1 according to the embodiment.

To avoid complexity, a reflective layer 6, a moisture-resistant body 7, a bonding layer 8, etc., are not illustrated in FIG. 1.

Figure 2:
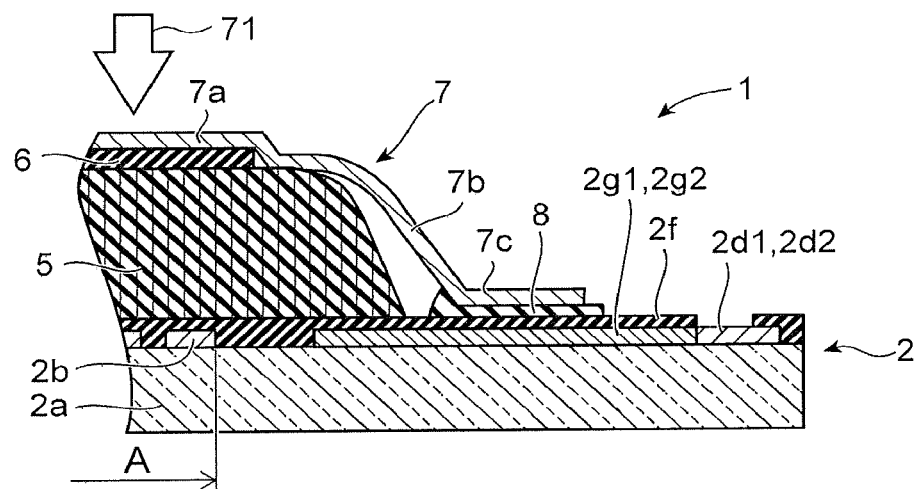
FIG. 2 is a schematic cross-sectional view of the peripheral edge vicinity of the X-ray detector 1.

FIG. 2 is a schematic cross-sectional view of the peripheral edge vicinity of the X-ray detector 1.

Figure 3:
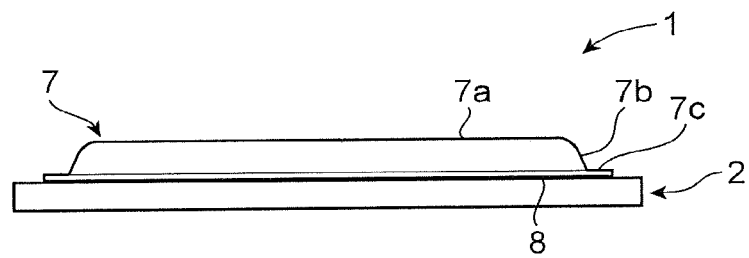
FIG. 3 is a schematic side view of the X-ray detector 1.

FIG. 3 is a schematic side view of the X-ray detector 1.

To avoid complexity, a circuit board 3, an image transmitter 4, etc., are not illustrated in FIG. 2 and FIG. 3.

Figure 4:
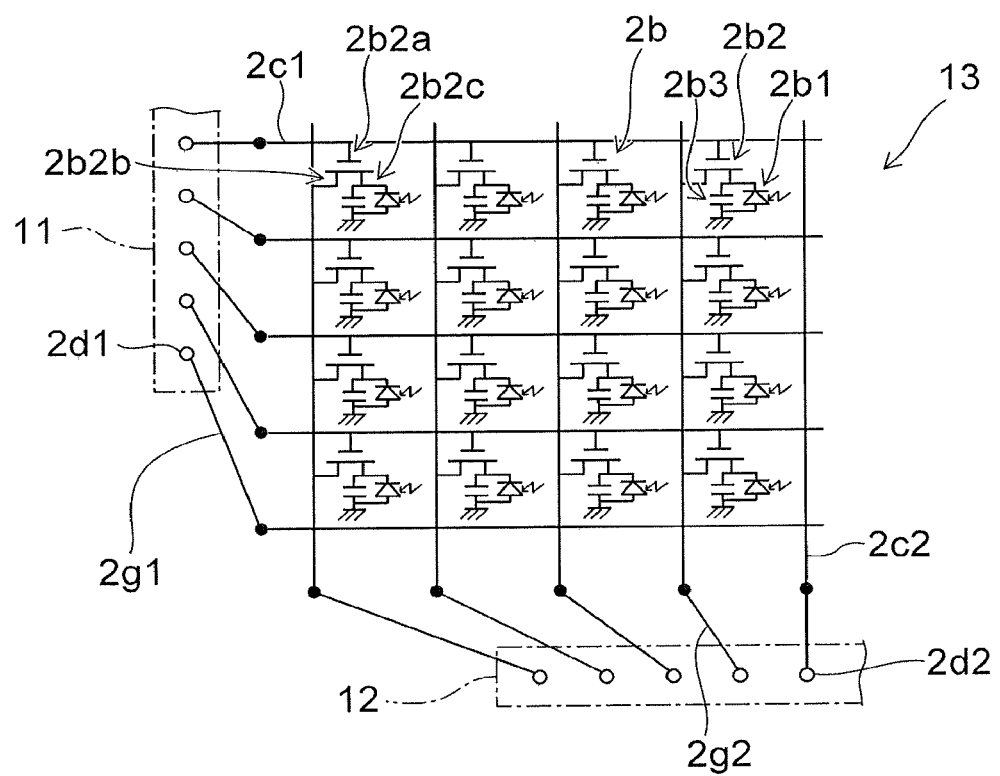
FIG. 4 is a circuit diagram of the X-ray detector 1.

FIG. 4 is a circuit diagram of the X-ray detector 1.

Figure 5:
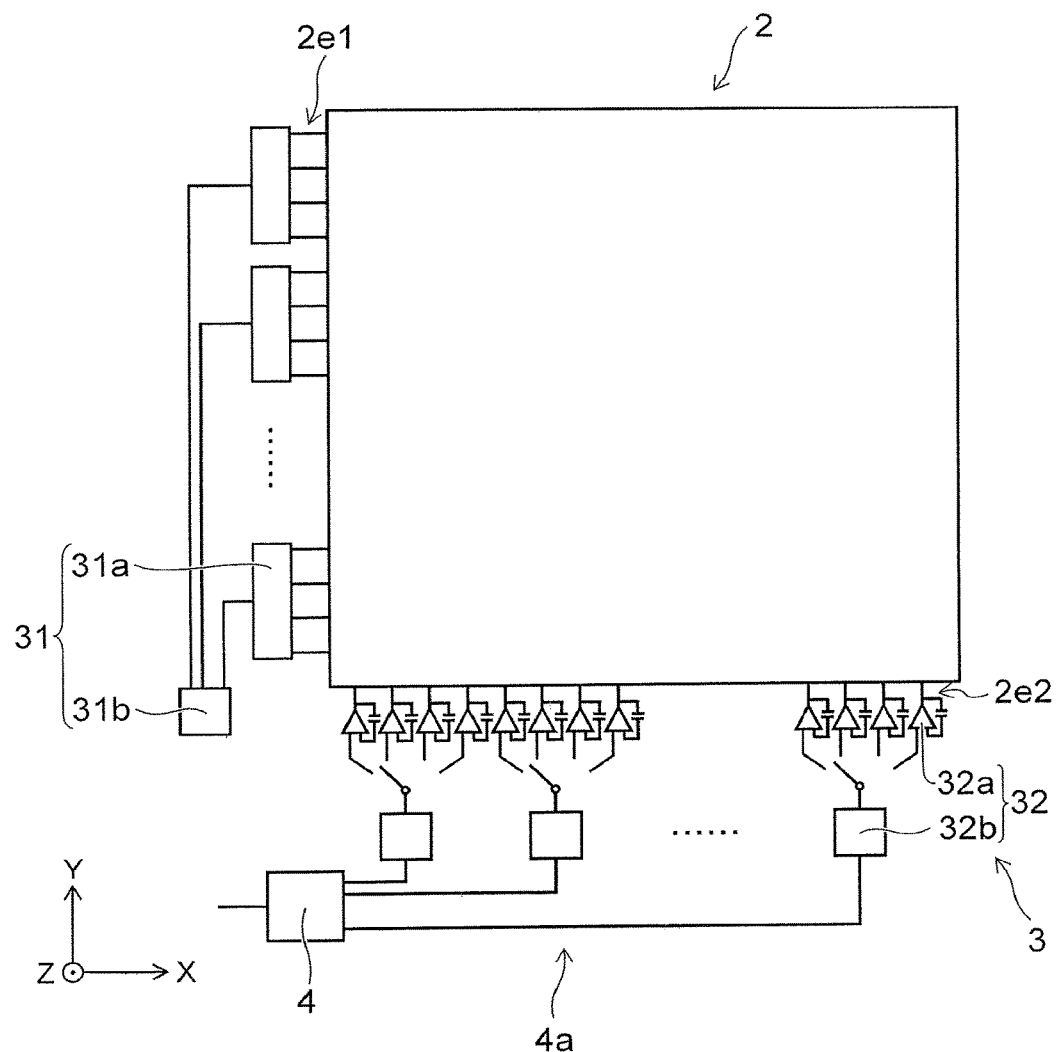
FIG. 5 is a block diagram of the X-ray detector 1.

FIG. 5 is a block diagram of the X-ray detector 1.

As shown in FIG. 1 to FIG. 3, the array substrate 2, the circuit board 3, the image transmitter 4, a scintillator layer 5, the reflective layer 6, the moisture-resistant body 7, and the bonding layer 8 are provided in the X-ray detector 1.

The array substrate 2 converts, into an electrical signal, the fluorescence (the visible light) converted from X-rays 71 by the scintillator layer 5.

The array substrate 2 includes a substrate 2a, photoelectric converters 2b, control lines (or gate lines) 2c1, data lines (or signal lines) 2c2, interconnect pads 2d1 (corresponding to an example of first interconnect pads), interconnect pads 2d2 (corresponding to an example of second interconnect pads), draw-out interconnects 2g1, and draw-out interconnects 2g2.

The substrate 2a has a plate configuration and is formed from a transparent material such as glass, etc.

The substrate 2a has a side 2a1 (corresponding to an example of a first side) extending in an X-direction (corresponding to an example of a first direction), and a side 2a2 (corresponding to an example of a second side) extending in a Y-direction (corresponding to an example of a second direction) crossing the X-direction.

The planar configuration of the substrate 2a can be a quadrilateral.

The photoelectric converters 2b are multiply provided at one surface of the substrate 2a.

The region where the multiple photoelectric converters 2b are provided is an effective pixel region A.

One photoelectric converter 2b corresponds to one pixel (pixel).

The photoelectric converters 2b have rectangular configurations and are provided respectively in multiple regions defined by the multiple control lines 2c1 and the multiple data lines 2c2.

The multiple photoelectric converters 2b are arranged in a matrix configuration.

A photoelectric conversion element 2b1 and a thin film transistor (TFT; Thin Film Transistor) 2b2 which is a switching element are provided in each of the multiple photoelectric converters 2b.

Also, a storage capacitor 2b3 that stores the signal charge converted by the photoelectric conversion element 2b1 can be provided (referring to FIG. 4). For example, the storage capacitor 2b3 can have a rectangular flat plate configuration and can be provided under the thin film transistor 2b2. However, according to the capacitance of the photoelectric conversion element 2b1, the photoelectric conversion element 2b1 also can be used as the storage capacitor 2b3.

The photoelectric conversion element 2b1 can be, for example, a photodiode, etc.

The thin film transistor 2b2 performs the switching between the storing and the discharging of the charge converted from the fluorescence by the photoelectric conversion element 2b1. The thin film transistor 2b2 can include a semiconductor material such as amorphous silicon (a-Si), polysilicon (P-Si), etc.

As shown in FIG. 4, the thin film transistor 2b2 includes a gate electrode 2b2a, a source electrode 2b2b, and a drain electrode 2b2c. The gate electrode 2b2a of the thin film transistor 2b2 is electrically connected to the corresponding control line 2c1. The source electrode 2b2b of the thin film transistor 2b2 is electrically connected to the corresponding data line 2c2. The drain electrode 2b2c of the thin film transistor 2b2 is electrically connected to the storage capacitor 2b3 and the corresponding photoelectric conversion element 2b1.

The control lines 2c1 are multiply provided to be parallel to each other and separated from each other at a prescribed spacing. The control lines 2c1 extend in the X-direction.

The multiple control lines 2c1 are electrically connected respectively to the multiple interconnect pads 2d1 provided in a peripheral edge region A1 of the substrate 2a via the draw-out interconnects 2g1. One end for each of the multiple interconnects provided in a flexible printed circuit board 2e1 are electrically connected respectively to the multiple interconnect pads 2d1. The other end for each of the multiple interconnects provided in the flexible printed circuit board 2e1 are electrically connected to a control circuit 31 provided in the circuit board 3.

The data lines 2c2 are multiply provided to be parallel to each other and separated from each other at a prescribed spacing. The data lines 2c2 extend in the Y-direction orthogonal to the X-direction.

The multiple data lines 2c2 are electrically connected respectively to the multiple interconnect pads 2d2 provided in the peripheral edge region A1 of the substrate 2a via the draw-out interconnects 2g2. One end for each of the multiple interconnects provided in a flexible printed circuit board 2e2 are electrically connected respectively to the multiple interconnect pads 2d2. The other end for each of the multiple interconnects provided in the flexible printed circuit board 2e2 are electrically connected to an amplifier/converter circuit 32 provided in the circuit board 3.

The draw-out interconnects 2g1 electrically connect the control lines 2c1 and the interconnect pads 2d1.

The draw-out interconnects 2g2 electrically connect the data lines 2c2 and the interconnect pads 2d2.

The control lines 2c1, the data lines 2c2, and the draw-out interconnects 2g1 and 2g2 are formed using a low-resistance metal such as aluminum, chrome, etc.

Details relating to the arrangement of the interconnect pads 2d1 and 2d2 are described below.

A protective layer 2f covers the photoelectric converters 2b, the control lines 2c1, the data lines 2c2, the draw-out interconnects 2g1 and 2g2, etc. (referring to FIG. 2).

The protective layer 2f includes, for example, at least one type of an oxide insulating material, a nitride insulating material, an oxynitride insulating material, or a resin material.

The oxide insulating material is, for example, silicon oxide, aluminum oxide, etc.

The nitride insulating material is, for example, silicon nitride, aluminum nitride, etc. The oxynitride insulating material is, for example, silicon oxynitride, etc.

The resin material is, for example, an acrylic resin, etc.

The scintillator layer 5 is provided on the effective pixel region A and converts the incident X-rays 71 into fluorescence, i.e., visible light. The scintillator layer 5 is provided to cover the effective pixel region A.

The scintillator layer 5 can be formed using, for example, cesium iodide (CsI):thallium (Tl), sodium iodide (NaI): thallium (Tl), etc. In such a case, an aggregate of columnar crystals can be formed using vacuum vapor deposition, etc.

The reflective layer 6 is provided to increase the utilization efficiency of the fluorescence and improve the sensitivity characteristics. In other words, the reflective layer 6 reflects the light of the fluorescence generated by the scintillator layer 5 and traveling toward the side opposite to the side where the photoelectric converters 2b are provided and causes the light to travel toward the photoelectric converters 2b.

The reflective layer 6 is provided to cover the surface on the front surface side of the scintillator layer 5 (the incident surface side of the X-rays 71).

For example, the reflective layer 6 can be formed using a film formation method such as sputtering, etc. In such a case, the reflective layer 6 can be formed from a metal having high light reflectance such as a silver alloy, aluminum, etc.

Also, for example, the reflective layer 6 can be formed by coating. In such a case, the reflective layer 6 can be formed from a resin including light-scattering particles of titanium oxide (TiO$_2$), etc.

Also, for example, the reflective layer 6 can be formed by bonding a plate-like body, etc. In such a case, the reflective layer 6 can be formed using a plate having a surface made of a metal having high light reflectance such as a silver alloy, aluminum, etc.

The reflective layer 6 illustrated in FIG. 2 is formed by coating, onto the scintillator layer 5, a material made by mixing a sub-micron powder made of titanium oxide, a binder resin, and a solvent and by drying.

The moisture-resistant body 7 is provided to suppress degradation of the characteristics of the scintillator layer 5 and the reflective layer 6 due to water vapor included inside the air.

As shown in FIG. 3, the moisture-resistant body 7 has a hat-like configuration and includes a front surface portion 7a, a perimeter surface portion 7b, and a brim (rim) portion 7c.

The front surface portion 7a, the perimeter surface portion 7b, and the brim portion 7c can be formed as one body in the moisture-resistant body 7.

The moisture-resistant body 7 can be formed from a material having a small moisture permeance.

For example, the moisture-resistant body 7 can be formed from aluminum, an aluminum alloy, a low moisture-permeability material, etc.

In the low moisture-permeability material, for example, a resin layer and an inorganic material (a light metal such as aluminum, etc., a ceramic material such as SiO$_2$, SiON, Al$_2$O$_3$, etc.) layer can be stacked.

Also, the thickness dimension of the moisture-resistant body 7 can be determined by considering the absorption of the X-rays 71, the rigidity of the moisture-resistant body 7, etc. In such a case, the absorption of the X-rays 71 becomes too high if the thickness dimension of the moisture-resistant body 7 is too thick. If the thickness dimension of the moisture-resistant body 7 is too thin, the rigidity decreases; and damage occurs easily.

For example, the moisture-resistant body 7 can be formed by pressing an aluminum foil having a thickness dimension of 0.1 mm.

The front surface portion 7a opposes the front surface side of the scintillator layer 5 (the incident surface side of the X-rays 71).

The perimeter surface portion 7b is provided to surround the peripheral edge of the front surface portion 7a. The perimeter surface portion 7b extends from the peripheral edge of the front surface portion 7a toward the substrate 2a.

The scintillator layer 5 and the reflective layer 6 are provided in the interior of the space formed by the front surface portion 7a and the perimeter surface portion 7b. In the case where the reflective layer 6 is not provided, the scintillator layer 5 is provided in the interior of the space formed by the front surface portion 7a and the perimeter surface portion 7b. A gap may be between the reflective layer 6 or the scintillator layer 5 and the front surface portion 7a and the perimeter surface portion 7b; or the front surface portion 7a and the perimeter surface portion 7b may contact the reflective layer 6 or the scintillator layer 5 without a gap.

The brim portion 7c is provided to surround the end portion of the perimeter surface portion 7b on the side opposite to the front surface portion 7a side. The brim portion 7c extends from the end portion of the perimeter surface portion 7b toward the outside. The brim portion 7c has an annular configuration and is provided to be parallel to the surface of the substrate 2a on the side where the photoelectric converters 2b are provided.

The brim portion 7c is bonded to the peripheral edge region A1 of the array substrate 2 via the bonding layer 8.

If the moisture-resistant body 7 having the hat-like configuration is used, it is possible to obtain high moisture resistance. In such a case, because the moisture-resistant body 7 is formed from aluminum, etc., the transmission of water vapor is exceedingly low.

The bonding layer 8 is provided between the brim portion 7c and the array substrate 2. The bonding layer 8 is formed by curing an ultraviolet-curing bonding agent.

Also, it is favorable for the moisture permeability (the transmittance of water vapor) of the bonding layer 8 to be as small as possible. In such a case, the moisture permeance of the bonding layer 8 can be reduced drastically by adding 70 weight % or more of inorganic talc (talc: $Mg_3Si_4O_{10}(OH)_2$) to the ultraviolet-curing bonding agent.

The circuit board 3 is provided on the side of the substrate 2a opposite to the side where the photoelectric converters 2b are provided (referring to FIG. 1).

The circuit board 3 includes the control circuit 31 and the amplifier/converter circuit 32.

In the peripheral edge region of the circuit board 3, interconnect pads 3a1, sockets, etc., that electrically connect the flexible printed circuit board 2e1 and the control circuit 31 are provided at positions corresponding to the interconnect pads 2d1 on the control line 2c1 side provided in the array substrate 2.

Also, in the peripheral edge region of the circuit board 3, interconnect pads 3a2, sockets, etc., that electrically connect the flexible printed circuit board 2e2 and the amplifier/converter circuit 32 are provided at positions corresponding to the interconnect pads 2d2 on the data line 2c2 side.

In the description recited below, the case where the interconnect pads 3a1 and 3a2 are provided in the peripheral edge region of the circuit board 3 is illustrated as an example.

Also, details relating to the arrangement of the interconnect pads 3a1 and 3a2 are described below.

As shown in FIG. 5, the control circuit 31 includes multiple gate drivers 31a and a row selection circuit 31b.

The gate driver 31a applies a control signal S1 to the corresponding control line 2c1.

The row selection circuit 31b transmits the control signal S1 from the outside to the corresponding gate driver 31a according to the scanning direction of the X-ray image.

For example, the control circuit 31 sequentially applies the control signal S1 to each control line 2c1 via the flexible printed circuit board 2e1 and the control line 2c1. The thin film transistor 2b2 is switched to the on-state by the control signal S1 applied to the control line 2c1; and the signal charge (an image data signal S2) can be received from the photoelectric conversion element 2b1.

The amplifier/converter circuit 32 includes multiple integrating amplifiers 32a and multiple A/D converters 32b.

The integrating amplifiers 32a receive the image data signal S2 from each of the photoelectric conversion elements 2b1 via the data lines 2c2, the interconnect pads 2d2, and the flexible printed circuit board 2e2, and amplifies and outputs the image data signals S2. The image data signals S2 that are output from the integrating amplifiers 32a are subjected to parallel/serial conversion and input to the A/D converters 32b.

The A/D converters 32b convert the input image data signals S2 (the analog signals) into digital signals.

The image transmitter 4 is electrically connected to the amplifier/converter circuit 32 of the circuit board 3 via interconnects 4a (referring to FIG. 1). The image transmitter 4 may be integrated with the circuit board 3.

The image transmitter 4 synthesizes the X-ray image based on the image data signals S2 converted into the digital signals by the multiple A/D converters 32b. The data of the synthesized X-ray image is output from the image transmitter 4 to an external device.

The arrangement of the interconnect pads 2d1 and 2d2 and the arrangement of the interconnect pads 3a1 and 3a2 will now be described further.

FIG. 6A is a schematic plan view for illustrating the array substrate 2 according to the embodiment. FIG. 6B is a schematic plan view for illustrating the circuit board 3 according to the embodiment.

Here, in FIG. 1, although the number of the photoelectric converters 2b is low for better understanding of the drawing, actually there are also cases where the number of the photoelectric converters 2b (the number of pixels) reaches several million.

Therefore, the number of the draw-out interconnects 2g1 and 2g2 is enormous.

Therefore, as shown in FIG. 6A, the effective pixel region A is subdivided into multiple blocks 13; and a region 11 (corresponding to an example of the first region) is provided where the interconnect pads 2d1 are provided for each row of the multiple blocks 13 arranged in a matrix configuration.

In other words, the region 11 is provided in the peripheral edge region A1 on the side 2a2 side of the substrate 2a. The multiple interconnect pads 2d1 that are electrically connected to the control lines 2c1 are provided in the region 11. The region 11 is multiply provided along the side 2a2.

Also, one flexible printed circuit board 2e1 is electrically connected to one region 11.

Also, a region 12 (corresponding to an example of the second region) is provided where the interconnect pads 2d2 are provided for each column of the multiple blocks 13.

In other words, the region 12 is provided in the peripheral edge region A1 on the side 2a1 side of the substrate 2a. The multiple interconnect pads 2d2 that are electrically connected to the data lines 2c2 are provided in the region 12. The regions 12 are multiply provided along the side 2a1.

Also, one flexible printed circuit board 2e2 is electrically connected to one region 12.

Thus, the interconnect operation can be performed for each of the regions 11 and 12. Therefore, the ease of the interconnect operation can be improved because the number of interconnects connected in one interconnect operation can be reduced.

The subdivided number of the effective pixel region A is not limited to that illustrated and can be modified appropriately according to the number of the photoelectric converters 2b.

In such a case, according to the number of the photoelectric converters 2b, the effective pixel region A may not be subdivided.

In the case where the effective pixel region A is not subdivided, one region 11 and one region 12 can be provided.

Figure 7A:
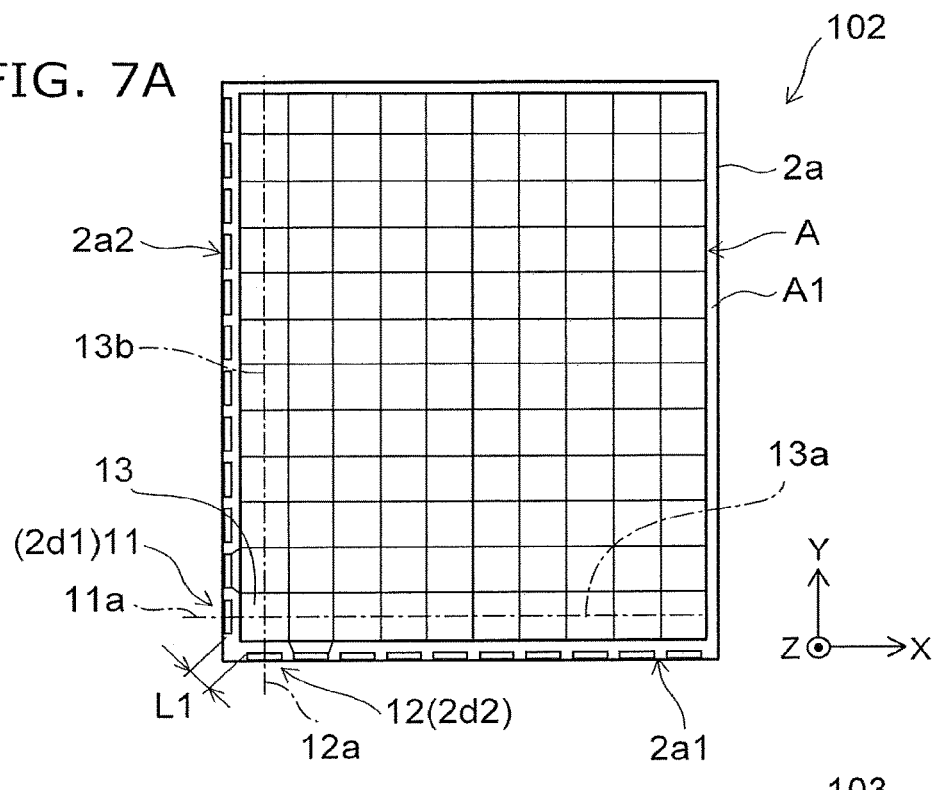
FIG. 7A is a schematic plan view for illustrating an array substrate 102 according to a comparative example.

FIG. 7A is a schematic plan view for illustrating an array substrate 102 according to a comparative example.

Figure 7B:
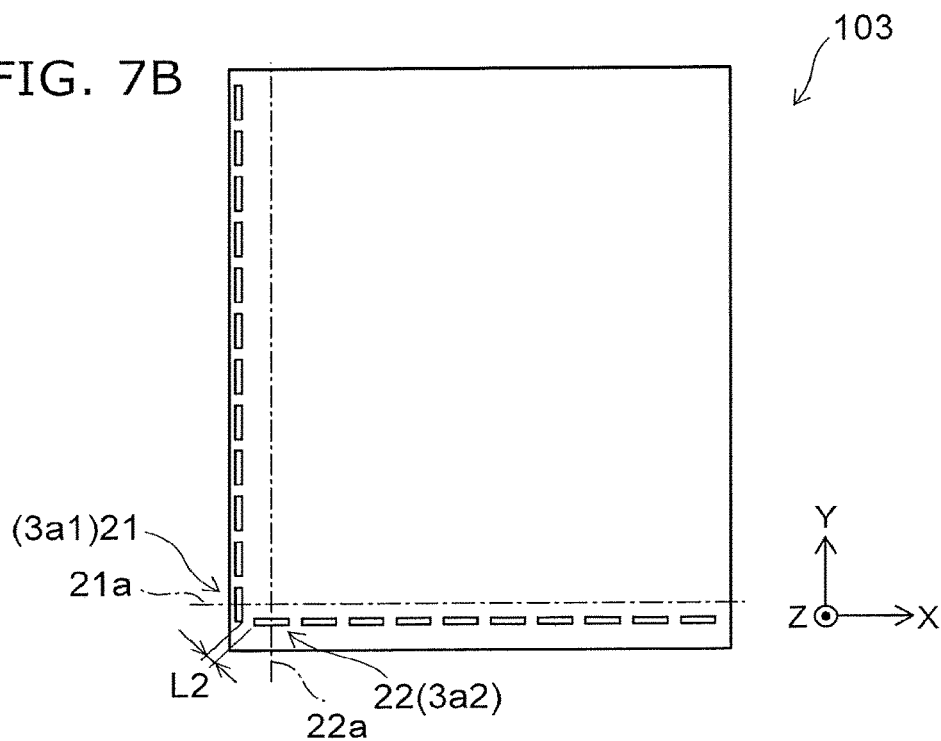
FIG. 7B is a schematic plan view for illustrating a circuit board 103 according to a comparative example.

FIG. 7B is a schematic plan view for illustrating a circuit board 103 according to a comparative example.

In the array substrate 102 according to the comparative example as shown in FIG. 7A, a center line 13a of a row of the multiple blocks 13 and a center line 11a of the region 11 are on the same straight line.

Also, a center line 13b of a column of the multiple blocks 13 and a center line 12a of the region 12 are on the same straight line.

Here, in recent years, to realize the downsizing of the X-ray detector 1, it is desirable to downsize the array substrate 2, that is, to shorten the dimensions of the array substrate 2 in the direction in which the control lines 2c1 extend and the direction in which the data lines 2c2 extend.

In such a case, because the effective pixel region A cannot be reduced, the dimensions of the peripheral edge region A1 having the frame-like configuration provided to surround the effective pixel region A is shortened.

However, in the case where the dimensions of the peripheral edge region A1 having the frame-like configuration are shortened, a distance L1 between the region 11 and the region 12 becomes short.

Therefore, there is a risk that the flexible printed circuit board 2e1 and the flexible printed circuit board 2e2 may interfere with each other, etc., and the interconnect operation may become difficult.

Also, as shown in FIG. 7B, the circuit board 103 includes a region 21 where the interconnect pads 3a1 of the control circuit 31 are provided and a region 22 where the interconnect pads 3a2 of the amplifier/converter circuit 32 are provided.

Generally, the planar configurations of the flexible printed circuit boards 2e1 and 2e2 are straight band configurations.

Also, as shown in FIG. 1, the array substrate 2 and the circuit board 3 are provided to be stacked.

Therefore, the center line 11a of the region 11 and a center line 21a of the region 21 are on the same straight line when the X-ray detector 1 is viewed from the Z-direction. Also, the center line 12a of the region 12 and a center line 22a of the region 22 are on the same straight line.

As a result, in the case where the distance L1 between the region 11 and the region 12 becomes short, a distance L2 between the region 21 and the region 22 correspondingly becomes short in the circuit board 103 as well.

Also, the control circuit 31 and the amplifier/converter circuit 32 are provided in the circuit board 103. Therefore, the electronic components such as resistors, semiconductor elements, etc., included in these circuits are provided in the circuit board 103.

Also, these electronic components are provided also at the vicinities of the regions 21 and 22.

In such a case, if the distance L2 between the region 21 and the region 22 becomes short, there is a risk that the distance between the electronic components included in the control circuit 31 and the electronic components included in the amplifier/converter circuit 32 may become too short; and the arrangement of the electronic components may be difficult.

As a result, there is a risk that the downsizing of the X-ray detector 1 can no longer be realized.

Conversely, in the array substrate 2 according to the embodiment as shown in FIG. 6A, the distance between the center line 11a of the region 11 and the side 2a1 on the side of the substrate 2a where the region 12 is provided is longer than the distance between the center line 13a of the row of the multiple blocks 13 and the side 2a1 of the substrate 2a.

In other words, the center line 11a of the region 11 is positioned on the side opposite to the side where the region 12 is provided with respect to the center line 13a of the row of the multiple blocks 13.

Also, the distance between the center line 12a of the region 12 and the side 2a2 on the side of the substrate 2a where the region 11 is provided is longer than the distance between the center line 13b of the column of the multiple blocks 13 and the side 2a2 of the substrate 2a.

In other words, the center line 12a of the region 12 is positioned on the side opposite to the side where the region 11 is provided with respect to the center line 13b of the column of the multiple blocks 13.

Thus, a distance L3 between the region 11 and the region 12 can be lengthened.

Therefore, the interference of the flexible printed circuit board 2e1 and the flexible printed circuit board 2e2 can be suppressed. Also, the interconnect operation is easier.

Also, as shown in FIG. 6B, the position of the center line 21a of the region 21 where the interconnect pads 3a1 on the control circuit 31 side are provided corresponds to the position of the center line 11a of the region 11.

In other words, the center line 21a of the region 21 is positioned on the side opposite to the side where the region 22 is provided with respect to a line 13a1 corresponding to the center line 13a of the row of the multiple blocks 13.

Also, the position of the center line 22a of the region 22 where the interconnect pads 3a2 on the amplifier/converter circuit 32 side are provided corresponds to the position of the center line 12a of the region 12.

In other words, the center line 22a of the region 22 is positioned on the side opposite to the side where the region 21 is provided with respect to a line 13b1 corresponding to the center line 13b of the column of the multiple blocks 13.

As a result, a distance L4 between the region 21 and the region 22 lengthens according to the distance L3 between the region 11 and the region 12. In the case where the distance L4 between the region 21 and the region 22 is lengthened, the distance between the electronic components included in the control circuit 31 and the electronic components included in the amplifier/converter circuit 32 can be lengthened; therefore, the arrangement of the electronic components becomes easy.

As a result, it becomes easy to realize the downsizing of the X-ray detector 1.

Although the case is illustrated above where the center line 13a and the center line 11a of the region 11 are shifted and the center line 13b and the center line 12a of the region 12 are shifted, at least one of these shifts may be performed.

In other words, it is sufficient to have at least one of the distance between the side 2a1 and the center line 11a extending in the X-direction of the region 11 being longer than the distance between the side 2a1 and the center line 13a extending in the X-direction of the region including the multiple control lines 2c1 electrically connected to the multiple interconnect pads 2d1 provided in the region 11, or the distance between the side 2a2 and the center line 12a extending in the Y-direction of the region 12 being longer than the distance between the side 2a2 and the center line 13b extending in the Y-direction of the region including the multiple data lines 2c2 electrically connected to the multiple interconnect pads 2d2 provided in the region 12.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. An array substrate, comprising:
a substrate having a first side extending in a first direction and a second side extending in a second direction, the second direction crossing the first direction;
a plurality of control lines extending in the first direction and being provided at the substrate;
a plurality of data lines extending in the second direction and being provided at the substrate;
photoelectric converters provided respectively in a plurality of regions defined by the plurality of control lines and the plurality of data lines, the plurality of regions being arranged in a plurality of blocks and the plurality of blocks being arranged in a plurality of rows extending in the first direction and a plurality of columns extending in the second direction;
a first region provided in a peripheral edge region on the second side of the substrate and including a first interconnect pad electrically connected to a group of the control lines; and
a second region provided in a peripheral edge region on the first side of the substrate and including a second interconnect pad electrically connected to a group of the data lines, wherein at least one of
a first distance between the first side and a first center line extending in the first direction through the first region that includes the first interconnect pad is longer than a second distance between the first side and a second center line extending in the first direction through a first row of the blocks, and
a third distance between the second side and a third center line extending in the second direction through the second region that includes the second interconnect pad is longer than a fourth distance between the second side and a fourth center line extending in the second direction through a first column of the blocks.

2. The array substrate according to claim 1, wherein a planar configuration of the substrate is a quadrilateral.

3. The array substrate according to claim 1, wherein the array substrate includes a plurality of the first regions along the second side.

4. The array substrate according to claim 1, wherein the array substrate includes a plurality of the second regions along the first side.

5. A radiation detector, comprising:
the array substrate according to claim 1;
a circuit board including a control circuit and an amplifier/converter circuit and being provided on a side of the array substrate opposite to a side where the photoelectric converters are provided;
a first flexible printed circuit board electrically connecting the control circuit and a plurality of first interconnect pads provided in the first region of the array substrate; and
a second flexible printed circuit board electrically connecting the amplifier/converter circuit and a plurality of second interconnect pads provided in the second region of the array substrate.

* * * * *